US009437681B2

(12) United States Patent
Lee et al.

(10) Patent No.: US 9,437,681 B2
(45) Date of Patent: Sep. 6, 2016

(54) DUAL CHANNEL FINFET CMOS DEVICE WITH COMMON STRAIN-RELAXED BUFFER AND METHOD FOR MANUFACTURING THEREOF

(71) Applicants: IMEC VZW, Leuven (BE); Samsung Electronics Co. Ltd., Suwon-si, Gyeonggi-do (KR)

(72) Inventors: Seung Hun Lee, Seoul (KR); Geert Eneman, Balen (BE)

(73) Assignees: IMEC VZW, Leuven (BE); Samsung Electronics Co. Ltd., Gyeonggi-do (KR)

( * ) Notice: Subject to any disclaimer, the term of this patent is extended or adjusted under 35 U.S.C. 154(b) by 0 days.

(21) Appl. No.: 14/709,696

(22) Filed: May 12, 2015

(65) Prior Publication Data

US 2016/0027876 A1    Jan. 28, 2016

(30) Foreign Application Priority Data

Jul. 25, 2014  (EP) .................................... 14178465

(51) Int. Cl.
*H01L 21/70* (2006.01)
*H01L 29/10* (2006.01)
*H01L 27/092* (2006.01)
(Continued)

(52) U.S. Cl.
CPC ... *H01L 29/1054* (2013.01); *H01L 21/823807* (2013.01); *H01L 21/823814* (2013.01); *H01L 21/823821* (2013.01); *H01L 27/092* (2013.01); *H01L 27/0924* (2013.01); *H01L 29/41783* (2013.01); *H01L 29/7848* (2013.01); *H01L 29/7849* (2013.01)

(58) Field of Classification Search
CPC .................. H01L 29/1054; H01L 21/823807; H01L 21/823814; H01L 21/823821; H01L 27/092; H01L 27/0924
USPC ......................................................... 257/369
See application file for complete search history.

(56) References Cited

U.S. PATENT DOCUMENTS

2011/0049613 A1   3/2011  Yeh
2011/0180847 A1   7/2011  Ikeda
(Continued)

FOREIGN PATENT DOCUMENTS

EP   2682983   1/2014
EP   2741320   6/2014
EP   2978017   1/2016

OTHER PUBLICATIONS

Eneman G et al. "Stress simulations for optimal mobility group IV p- and nMOS FinFETs for the 14 nm node and beyond", 2012 International Electron Devices Meeting (IEDM 2012); San Francisco, CA, US.

*Primary Examiner* — Matthew Gordon
(74) *Attorney, Agent, or Firm* — McDonnell Boehnen Hulbert & Berghoff LLP

(57) ABSTRACT

A CMOS semiconductor FinFET device and a method for manufacturing a CMOS semiconductor FinFET device are disclosed. The device may comprise an nFinFET and a pFinFET having a channel region comprising Ge on a common strain-relaxed buffer layer comprising SiGe. The concentration of Ge in the channel regions is higher than the concentration of Ge in the strain-relaxed buffer layer. The device further comprises a source/drain region for the nFinFET, the source/drain region comprising SiGe; and a source/drain region for the pFinFET, the second source/drain region comprising Ge.

19 Claims, 8 Drawing Sheets

(51) Int. Cl.
  *H01L 29/78* (2006.01)
  *H01L 21/8238* (2006.01)
  *H01L 29/417* (2006.01)

(56) References Cited

U.S. PATENT DOCUMENTS

2012/0091528 A1  4/2012  Chang
2013/0011983 A1  1/2013  Tsai
2013/0023092 A1  1/2013  Oda
2013/0285153 A1  10/2013  Lee
2014/0367741 A1* 12/2014  Yang ................. H01L 29/04
                                             257/190
2015/0340500 A1* 11/2015  Brunco ............. H01L 21/02532
                                             257/190

* cited by examiner

DUAL CHANNEL FINFET CMOS DEVICE WITH COMMON STRAIN-RELAXED BUFFER AND METHOD FOR MANUFACTURING THEREOF

CROSS-REFERENCE TO RELATED APPLICATIONS

The present application is a non-provisional patent application claiming priority to European Patent Application No. 14178465.2 filed Jul. 25, 2014, the contents of which are hereby incorporated by reference.

FIELD OF THE DISCLOSURE

The present disclosure relates to transistor devices, more specifically to FinFET CMOS devices with common buffer and method for manufacturing thereof.

BACKGROUND

Strain engineering refers to a general strategy employed in semiconductor manufacturing to enhance device performance. Performance benefits are achieved by modulating mechanical strain in the transistor channel, which enhances electron mobility (or hole mobility) and thereby conductivity through the channel.

One particular consideration in using strain engineering in CMOS technologies is that PMOS transistors and NMOS transistors respond differently to different types of strain. Specifically, for industry standard transistors oriented along <110> crystallographic directions, PMOS transistor performance is best served by applying compressive longitudinal strain to the p-channel, whereas NMOS transistor receives benefit from tensile longitudinal strain applied to the n-channel. Different approaches to strain-engineering locally induce strain, allowing both re-channel and p-channel strain to be modulated independently.

NMOS transistors (or NFET) and PMOS transistors (or PFET) thus may include opposing strains for mobility enhancement. Therefore a mobility enhancement for one of the transistors can lead to degradation of performance for the other transistor. To avoid degradation of performance for one of the transistor types, or to obtain mobility enhancement for both at the same time is not straightforward.

One approach involves performing multiple epitaxial growth steps of different types of strained-relaxed buffers and channels. However, these epitaxial growth steps need to be masked such that their growth is performed either on the NFET or on the PFET. These masking steps are both technically challenging and costly.

The migration from conventional planar CMOS technology to non-planar (three dimensional—3D) CMOS technology (also referred to as multi-gate technology, such as for example FINFET) has enabled further device scaling. Due the difference in mobility of the carriers when moving along the sidewall surfaces or the top surface, strain engineering needs to be further improved for non-planar CMOS technology.

SUMMARY

The present disclosure relates to a dual-channel FinFET device having a common strain relaxed buffer (SRB) layer and to a method of manufacturing thereof.

In a first aspect of the present disclosure, a CMOS device is disclosed, the CMOS device comprising a semiconductor substrate, a patterned strain-relaxed buffer layer of fins, comprising SiGe on the semiconductor substrate; on the patterned strain-relaxed buffer layer, an nFinFET having an n-channel region and a pFinFET having a p-channel region, both channel regions isolated from each other by an isolation region and comprising Ge whereby the concentration of Ge in the channel regions is higher than the concentration of Ge in the strain-relaxed buffer layer, and further comprising source/drain regions comprising SiGe for the nFinFET, and source/drain regions comprising Ge for the pFinFET.

According to embodiments, the concentration of Ge in the strain-relaxed buffer layer may be in the range of 25% to 90% (atomic percentage). The concentration of Ge in the channel region of the nFinFET and of the pFinFET may be in the range of 90-100%.

According to embodiments, the concentration of Ge in the nFinFET source/drain regions is lower than the concentration of Ge in the strain-relaxed buffer layer. The concentration of Ge in the nFinFET source/drain region may be less than 80%. The concentration of Ge in the pFinFET source/drain regions may be higher than the concentration of Ge in the strain-relaxed buffer layer. The concentration of Ge in the pFinFET source/drain regions may be in the range between 35% and 100%.

According to embodiments, the nFinFET may have recessed source/drain regions and the pFinFET may have raised source/drain regions.

According to embodiments, the p-channel region and the n-channel region consist of the same material.

In a second aspect of the present disclosure, a method for manufacturing a CMOS device is disclosed The method comprises the steps of providing a semiconductor substrate; providing a patterned strain-relaxed buffer layer of fins comprising SiGe on the semiconductor substrate; providing on the fins of the patterned strain-relaxed buffer layer an nFinFET and a pFinFET isolated by an isolation region, the nFinFET having an n-channel region and the pFinFET having a p-channel region, whereby both channel regions comprise Ge in a concentration higher than the concentration of Ge in the strain-relaxed buffer layer; providing source/drain regions comprising SiGe for the nFinFET and providing source/drain regions comprising Ge for the pFinFET.

According to embodiments providing the patterned strain-relaxed buffer layer comprises providing the strain-relaxed buffer layer on the semiconductor substrate; patterning the strain-relaxed buffer layer thereby forming fins; providing a dielectric layer on the patterned strain-relaxed buffer layer.

According to embodiments providing on the fins of the patterned strain-relaxed buffer layer an nFinFET and a pFinFET further comprises recessing a top part of the fins of the patterned strain-relaxed buffer layer thereby forming trenches having a reduced depth; epitaxial growing in the reduced depth trenches on the strain-relaxed buffer layer an upper layer thereby forming the n-channel of the nFinFET and the p-channel of the pFinFET; removing top part of the dielectric layer thereby revealing the n-channel and p-channel.

According to embodiments providing the patterned strain-relaxed buffer layer comprises patterning the semiconductor substrate thereby forming semiconductor fins isolated from each other by isolation regions; recessing the semiconductor material of the semiconductor fins down to the bottom part of the isolation regions thereby forming trenches in between the isolation regions; epitaxial growing the strain-relaxed buffer layer in part of the trenches thereby forming fins.

According to embodiments providing on the fins of the patterned strain-relaxed buffer layer an nFinFET and a pFinFET further comprises epitaxial growing an upper layer on the epitaxial grown strain-relaxed buffer layer in the remaining part of the trenches thereby forming the n-channel and the p-channel; removing top part of the dielectric layer thereby revealing the n-channel and p-channel.

According to embodiments the concentration of Ge in the strain-relaxed buffer layer is in the range of 25% to 90%.

According to embodiments providing the nFinFET source/drain regions comprises providing recessed source/drain regions, and providing the pFinFET source/drain regions comprises providing raised source/drain regions.

According to embodiments the concentration of Ge in the nFinFET source/drain regions is less than the concentration of Ge in the strain-relaxed buffer layer, and wherein the concentration of Ge in the pFinFET source/drain regions is higher than concentration of Ge in the strain-relaxed buffer layer.

According to embodiments the concentration of Ge in the nFinFET source/drain regions is in the range between 35% and 100%, and wherein the concentration of Ge in the pFinFET source/drain regions is less than 80%.

According to embodiments the p-channel region and the n-channel region consist of the same material, being the upper layer material.

According to embodiments the SRB layer as well as the upper layer formed on the SRB layer may further comprise dopants. For example, dopant elements such as P, As, or B may be used.

It is an advantage of the present disclosure that a CMOS FinFET device is provided with a common SRB layer and a common channel material; the PMOS FinFET device and NMOS FinFET device are thus manufactured starting from the same SRB layer and the same channel layer.

It is an advantage of the present disclosure that a CMOS FinFET device is provided with a higher mobility using a minimum number of materials. The performance of the CMOS FinFET device is much better than the state-of-the-art Si-based CMOS FinFET devices, both for the PMOS FinFET device and NMOS FinFET device.

It is an advantage of the present disclosure that a method is provided for forming a CMOS FinFET device with higher mobility using a minimum number of processing steps.

It is an advantage of the present disclosure that costs are reduced for manufacturing such a device as the amount of processing steps is reduced compared to state-of-the-art CMOS FinFET devices.

It is an advantage of the present disclosure that a CMOS FinFET device, i.e. a PMOS FinFET and NMOS FinFET device, is provided which is compatible with sub-10 nm technology nodes.

BRIEF DESCRIPTION OF THE FIGURES

All drawings are intended to illustrate some aspects and embodiments of the present disclosure. The drawings described are only schematic and are non-limiting.

DETAILED DESCRIPTION

Figure 1:
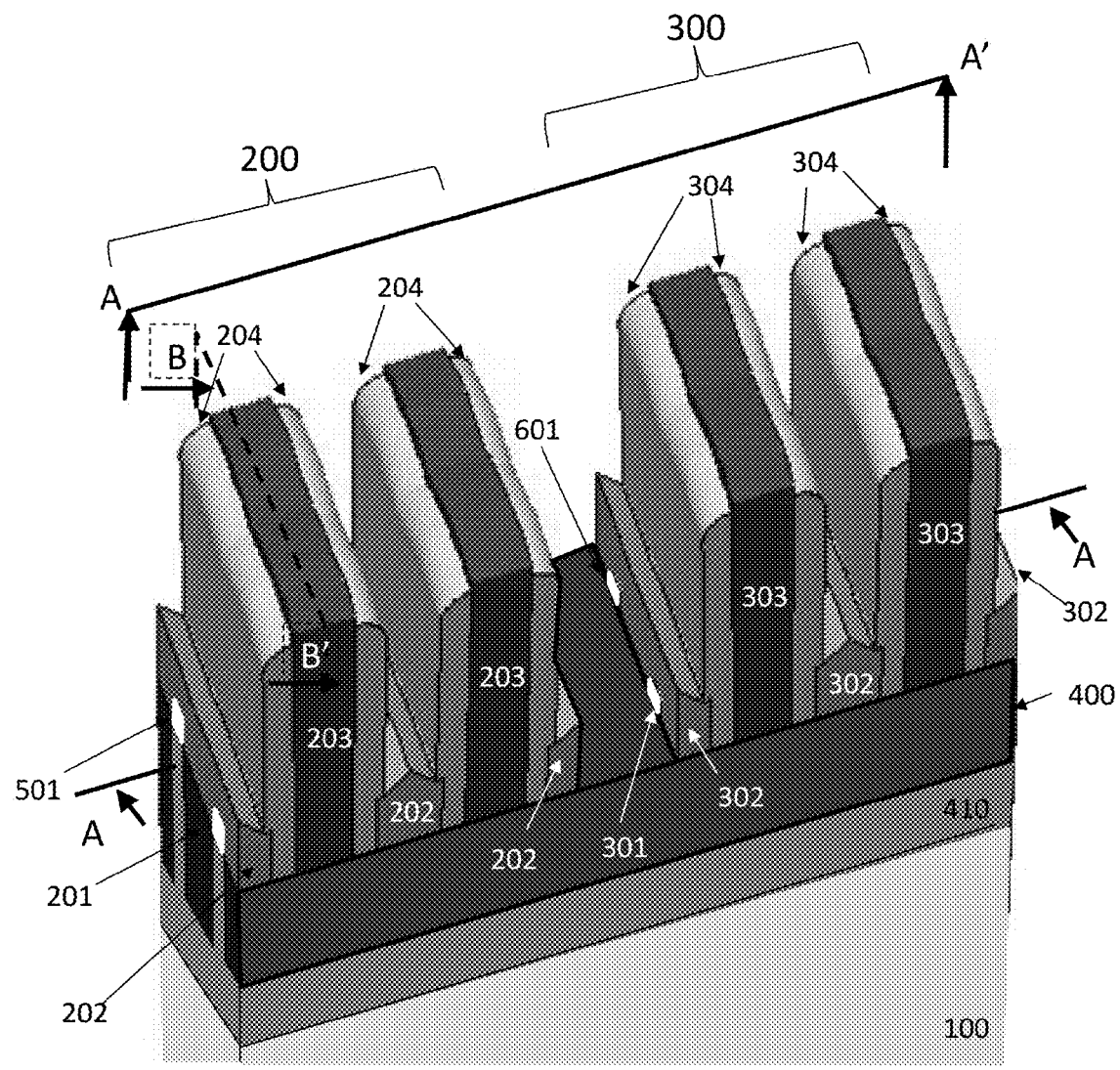
FIG. 1 shows a schematic three-dimensional (3D) representation of a CMOS semiconductor FinFET device according to the first aspect comprising different fins and different transistors Both the nFinFET and pFinFET have each two fins in parallel and two transistors in series.

The present disclosure relates to a dual-channel FinFET device having a common strain relaxed buffer (SRB) layer and to a method of manufacturing the device thereof.

The present disclosure will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may.

Furthermore, the particular features, structures or characteristics may be combined in any suitable manner, as would be apparent to one of ordinary skill in the art from this disclosure, in one or more embodiments.

Furthermore, while some embodiments described herein include some but not other features included in other embodiments, combinations of features of different embodiments are meant to be within the scope of the disclosure, and form different embodiments, as would be understood by those in the art.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Throughout the disclosure, whenever referred to a CMOS FinFET or dual channel FinFET device, it is a device comprising at least two FinFETs, one FinFET with a p-type channel (pFinFET) and another FinFET with an n-type channel (nFinFET).

Throughout the disclosure, the terms 'tensile strain' and 'compressive strain' are used. In general, when a first layer is overlying and in physical contact with a second layer having a different lattice constant, a tensile strain is induced in the first layer when the lattice of the first layer is stretched to mimic the larger lattice constant of the second layer. Conversely, compressive strain is induced in the first layer when the second layer has a smaller lattice constant and thus the lattice of the first layer is squeezed to mimic the smaller lattice constant.

For planar MOSFETs with a $Si_{1-x}Ge_x$ channel oriented along a <110> crystallographic direction, the electron mobility and hence nFET performance is improved by applying tensile longitudinal stress to the n-channel. Compressive longitudinal channel stress degrades electron mobility and pFET performance. For improved hole mobility and nFET performance, compressive longitudinal stress is needed in the p-channel. Tensile longitudinal channel stress degrades hole mobility and pFET performance. As a consequence, most strain techniques use different process steps for pFET and nFET to ensure that the correct sign of stress, i.e. tensile or compressive, is applied to the correct type of transistor, i.e. nFET or pFET.

When using a standard (100) wafer surface with a <110> notch, the electron mobility in a silicon-channel nFinFET is compromised significantly due to the less favorable crystal orientation of the sidewall surfaces. The largest contribution to the overall drain current comes from these sidewall surfaces with (110)/<110> orientation/direction, which is the worst case for electron mobility in silicon. The (100)/<110> orientation/direction at the top surface of the nFinFET however is very beneficial for electron mobility, but this part only has a smaller contribution to the overall drain current. For a germanium-channel nFinFET however the opposite occurs. While the (110)/<110> orientation/direction at the sidewall surfaces is very beneficial for the electron mobility in Ge, the (100)/<110> orientation/direction at the top surface is less favorable. For a silicon- or germanium-channel pFinFET, the (110)/<110> orientation/direction at the sidewall surfaces is very beneficial for the hole mobility, the (100)/<110> orientation/direction at the top surface is less favorable.

FinFETs have a conducting channel at the top of the semiconductor fin and at the sides of the semiconductor fin. As the top and sides of the fin are oriented along different crystallographic directions, the mobilities at the top and sides of the fin are different both for electrons and holes, even without applying mechanical stress. For Ge based fins for example hole and electron mobilities have therefore opposite sensitivity to stress.

For Ge pFinFETs on a {100} wafer with a fin having a top surface in a (100)/<110> direction and sidewall surface in (110)/<110> direction, the unstrained hole mobility is higher than for unstrained silicon. However, the unstrained Ge pFinFET hole mobility is lower than the hole mobility of a strained Si pFinFETs. Therefore mobility enhancement may be useful for Ge pFinFETs to outperform strained Si pFinFETs.

For Ge nFinFETs on a {100} wafer with having a top surface in a (100)/<110> direction and sidewall surface in (110)/<110> direction, the unstrained electron mobility is higher than unstrained or strained Si nFinFETs. Theoretically, the performance of Ge nFinFETs should be significantly higher than unstrained or strained Si nFinFETs. As the electron mobility for these Ge nFinFETs is sufficiently high, a limited amount of compressive longitudinal channel stress can be tolerated in the Ge channel. Even though this compressive stress reduces the achievable electron mobility and nFinFET performance than for unstrained devices with a Ge channel, it still can outperform strained Si nFinFETs.

A first aspect of the present disclosure relates to a dual channel FinFET device, wherein each of the FinFETs (both nFinFET and pFinFET) is subjected to a strain enhancing the carrier mobility.

A second aspect of the present disclosure relates to a method for manufacturing such a dual channel FinFET device, wherein each of the FinFETs (both nFinFET and pFinFET) are subjected to a strain enhancing the carrier mobility.

By using a common buffer layer and a common channel material for both nFinFET and pFinFET, difficulties in integration of different materials is alleviated. Also costs are reduced and high-volume manufacturing is facilitated. More specifically by using Ge technology for both nFinFET and pFinFET, the device properties and strain properties outperform state-of-the-art Si technology CMOS devices. The limited mobility degradation for Ge nFinFET is allowed, as the Ge nFinFET still outperforms state-of-the-art Si NFinFETs.

Figure 2:
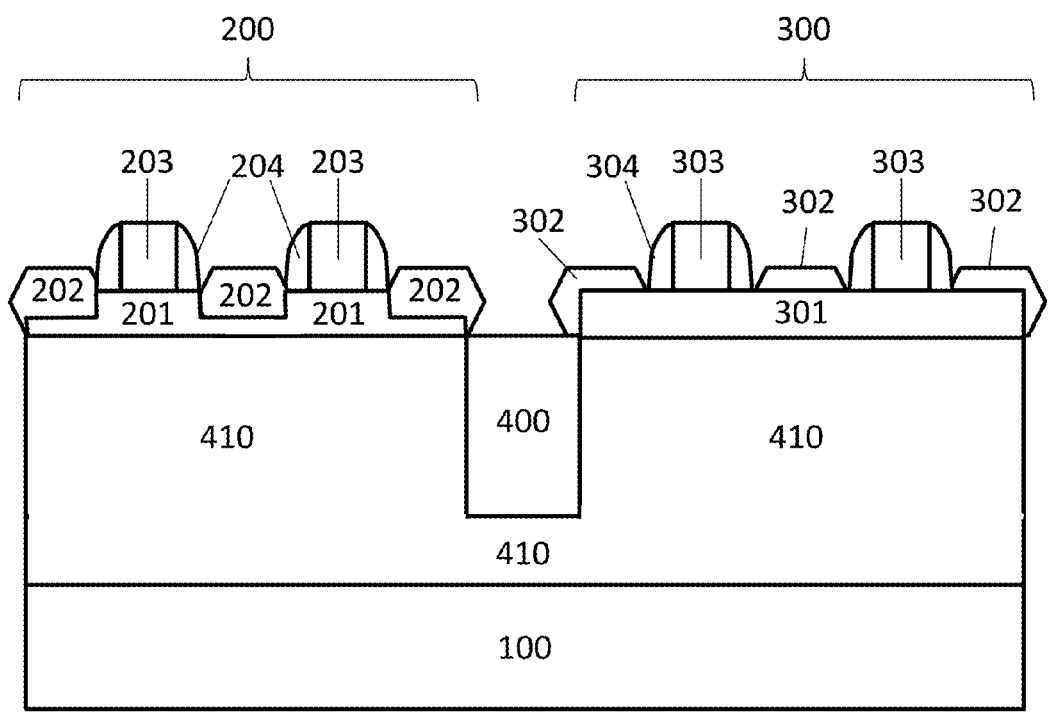
FIG. 2 shows a schematic two-dimensional (2D) cross-sectional view along line A-A' of the three-dimensional (3D) device of FIG. 1. Line A-A' is a cross-section made through the whole length of a fin for both nFinFET and pFinFET.
Figure 3:
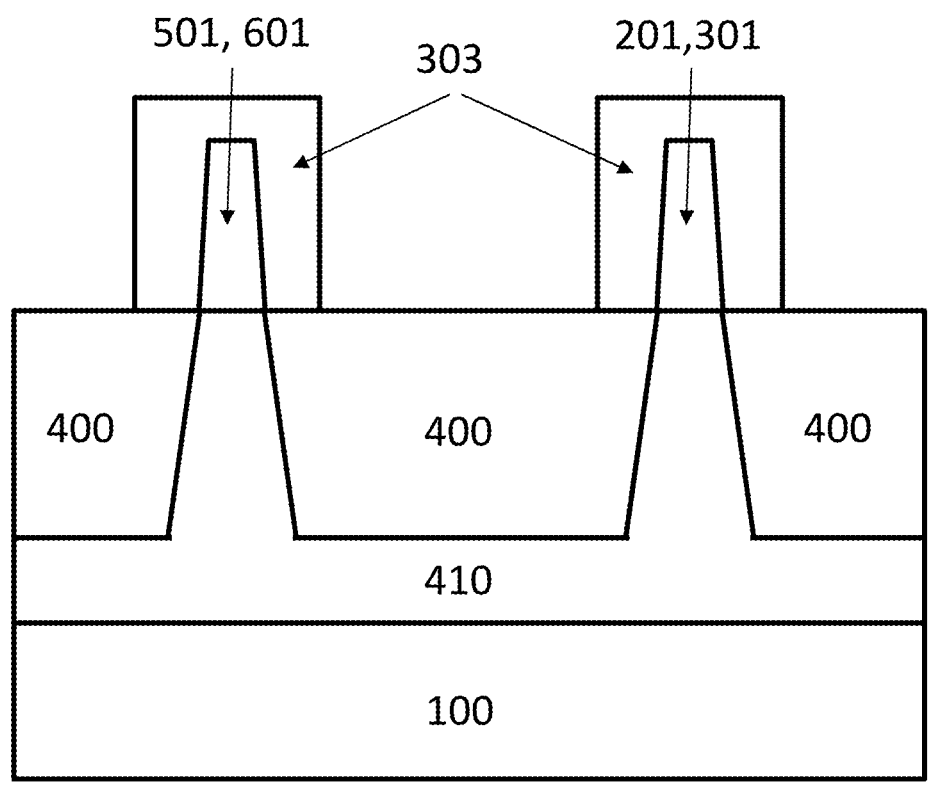
FIG. 3 shows a schematic two-dimensional (2D) cross-sectional view along line B-B' of the three-dimensional (3D) device of FIG. 1. Line B-B' is a cross-section made through a gate stack, i.e. through a set of two parallel fins for example for the nFinFET.

A schematic three-dimensional (3D) representation of a CMOS device, i.e. a dual channel semiconductor FinFET device according to the first aspect is shown in FIG. 1. A patterned strain-relaxed buffer (SRB) layer 410 is present on a substrate 100. The SRB layer 410 is patterned into a set of protrusions or fins (as an example, four parallel fins are shown in FIG. 1 and two parallel fins are shown in FIG. 2 and FIG. 3), which extend from the substrate 100. In between the fins of the patterned SRB layer 410, an isolation region 400 is present, such as a shallow trench isolation (STI) region.

In the following, certain embodiments will be described with reference to a silicon (Si) substrate, but it should be understood that they apply equally well to other semiconductor substrates. In embodiments, the "substrate" may include a semiconductor substrate such as e.g. a silicon, a germanium (Ge), or a silicon germanium (SiGe) substrate, a gallium arsenide (GaAs), a gallium arsenide phosphide (GaAsP), an indium phosphide (InP). The "substrate" may include for example, an insulating layer such as a $SiO_2$ or a $Si_3N_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

The substrate may comprise a semiconductor material such as Si or Ge. The substrate can, for example, be made of silicon, silicon on insulator, germanium on insulator.

According to embodiments, the SRB layer 410 may include a material with a smaller lattice constant than Ge. To have compressively stress in the channel the SRB layer needs to be a $Si_{1-x-y}Ge_xSn_y$ layer with x+5y<=1 with x,y being real numbers smaller than or equal to 1 (or in percentages: x(in %)+5y(in %)<=100 with x,y being real numbers smaller than or equal to 100). The concentration of Ge in the SRB layer is preferably in a range between 25% to 90% (atomic percentage). According to embodiments, a small percentage of Carbon may be added, such as less than 10% of C.

On the patterned SRB layer 410, an nFinFET region 200 and a pFinFET region 300 is shown, each region consisting of two parallel fins and two transistors in series. On each of the fins of the patterned SRB layer 410 an upper layer 201, 501 and 301, 601 is present which form the channel regions of both the nFinFETs 200 and pFinFETs 300 respectively. The upper layer has also fin-based shapes 201, 301, 501, 601 protruding above the patterned SRB layer 410 and the isolation region 400. The upper layer comprises thus the active regions of the CMOS device.

For the nFinFET 200, the upper layer comprises an n-channel region 201, 501 on the patterned SRB layer 410. For the pFinFET 300 the upper layer comprises a p-channel region 301, 601 on the patterned SRB layer 410. Both the n-channel region 201, 501 and the p-channel region 301, 601 comprise Ge. The concentration of Ge in the channel regions should be higher than the concentration of the Ge in the SRB layer.

The composition of the nFinFET and the pFinFET channel is identical and comprises a semiconductor material such as $A_{1-x}Ge_x$ with 0.9<=x<=1 and A=Si, Sn, C or a combination thereof.

The composition of the pFinFET and nFinFET is selected to have a lattice constant for the channel larger than the lattice constant of the SRB in strain-relaxed state. In doing so, the channel region after growth on the SRB will be under a compressive uniaxial stress state.

The nFinFET 200 further comprises a source/drain region 202 comprising SiGe. The source/drain region 202 for the nFinFET may include a recessed source/drain region. For the nFinFET the recessed source/drain region can relieve unwanted stress exerted on the channel by the underlying SRB layer. The channel layer (upper layer) is etched to form recesses to accommodate the source/drain regions. The recess, i.e. the cavity, is refilled with a material having a lattice constant different from the channel region material (the upper layer). The depth of this recess may be between 0 and 50 nm. By increasing the depth of the recess, the compressive longitudinal stress exerted on the channel region is reduced.

The pFinFET 300 further comprises a source/drain region 302 comprising Ge. For the pFinFET, the maximal compressive stress is obtained when the source/drain is raised. The source/drain regions are then formed on top of the channel layer instead of in a recess formed, i.e. for a raised source/drain region. Therefore the source/drain region 302 for the pFinFET is preferably a raised source/drain region.

According to embodiments the concentration of Ge in nFinFET source/drain region is lower than the concentration of Ge in the SRB layer. The concentration of Ge in the pFinFET source/drain region is higher than concentration of Ge in the SRB layer. The concentration of Ge in the nFinFET source/drain region may be in a range between 35% and 100%. The concentration of Ge in the pFinFET source/drain region may be lower than 80%. By having a lower Ge concentration in the source/drain regions for the nFinFET, additional tensile stress is introduced in the nFinFET channel. By having a higher Ge concentration in the source/drain regions for the pFinFET, additional compressive stress is introduced in the pFinFET channel.

Both nFinFET 200 and pFinFET 300 both comprise a gate stack 203, 303 respectively, wrapped around the channel regions. The gate stack 203, 303 comprise a gate dielectric layer and gate conductive layer. Further spacers 204, 304 are present next to the gate stack.

Additional layers may be present in the substrate-SRB-channel layer stack such as a quantum barrier layer. Additional epitaxial layers may be present that belong to the gate stack. These additional layers may however not disturb the stress transfer from the SRB layer to the upper (channel) layer.

FIG. 2 shows a schematic two-dimensional (2D) cross-sectional view along line A-A' of the three-dimensional (3D) device of FIG. 1. Line A-A' is a cross-section made through the whole length of the fins.

Both nFinFET 200 and pFinFET 300 are shown. Both nFinFET 200 and pFinFET 300 have a substrate 100 and a (patterned) strain relaxed buffer (SRB) layer 410 in common. The nFinFET 200 and pFinFET 300 are isolated from each other by the isolation region 400. The isolation region 400 between the nFinFET 200 and the pFinFET 300 may be a shallow trench isolation (STI) region.

The nFinFETs 200 and pFinFETs 300 are formed from a common upper layer which is present on the patterned SRB layer. The upper layer is formed as fins. The nFinFETs 200 comprise an n-channel region 201, a gate structure 203 with spacers 204 aside wrapped around the n-channel region 201 and source/drain regions 203. The pFinFETs 300 comprise a p-channel region 301, a gate structure 303 with spacers 304 aside wrapped around the p-channel region and source/drain regions 303. The n-channel region 201 of the fin and the p-channel region 301 of the fin are above and additionally may be in physical contact with the underlying patterned SRB layer 410.

The fin (or upper layer) is made of a conductive material, which may comprise Ge. Both nFinFET 200 and pFinFET 300 thus comprise a common SRB layer and a common channel material common to the n-channel region 201 and p-channel region 301.

FIG. 3 shows a schematic two-dimensional (2D) cross-sectional view along line B-B' of the three-dimensional (3D) device of FIG. 1. Line B-B' is a cross-section made across two parallel fin structures, i.e. along the length of the gate stack. Two nFinFETs 201, 501 are shown, which are isolated from each other by an isolation region 400.

A second aspect of the present disclosure relates to a method for manufacturing a dual channel FinFET device, wherein each of the FINFETs (nFinFET and pFinFET) is subjected to a strain enhancing the carrier mobility.

Figure 7A:
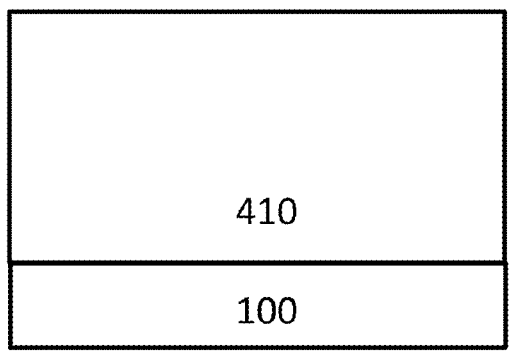
FIG. 7A to FIG. 7F show schematic representation of different process steps of a method for manufacturing a CMOS device according to certain embodiments of the second aspect.
Figure 7B:
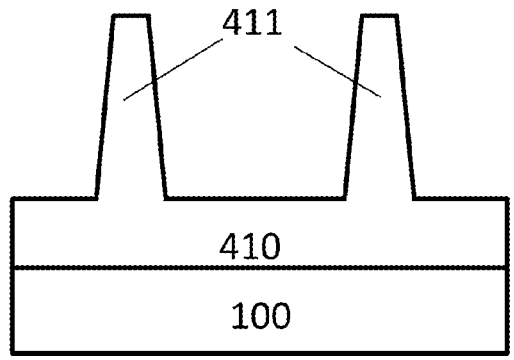
Figure 7C:
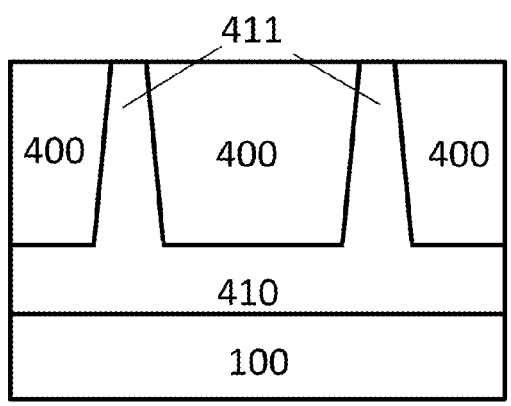
Figure 7D:
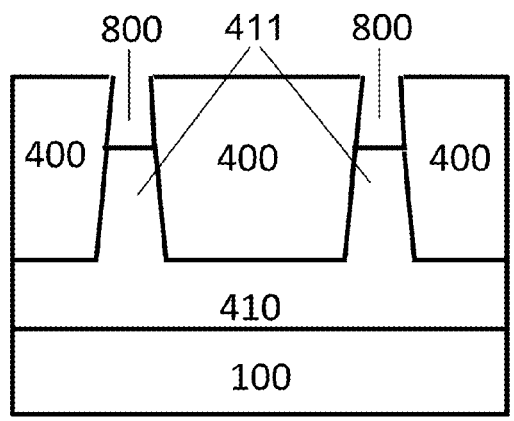
Figure 7E:
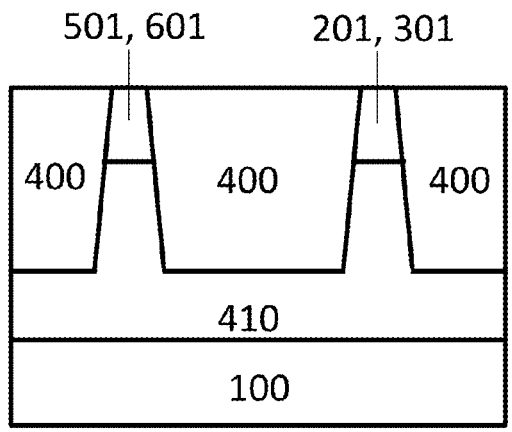
Figure 7F:
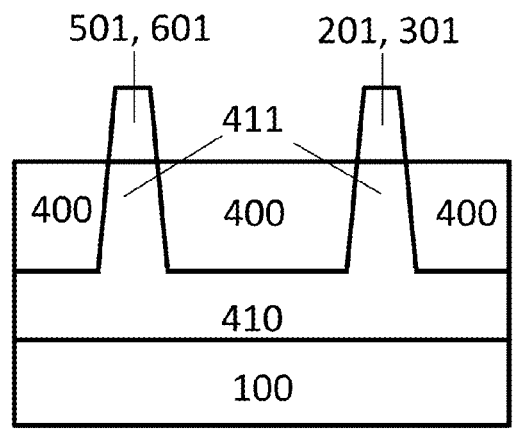

In different embodiments of the disclosure, the SRB layer is first grown on a blanket substrate (FIG. 7A). Thereafter the SRB layer is patterned into fins (FIG. 7B) and the removed SRB material is replaced by dielectric material thereby forming the isolation regions 400. The strain relaxed buffer-material left in between two isolation areas, i.e. the active area, is subsequently partially recessed to form trenches having a reduced depth 800 (FIG. 7D). In these reduced depth trenches 800 the upper layer 201, 301, 501, 601 that will form the channels of the FinFET CMOS device are subsequently formed by epitaxial growth (FIG. 7E). Thereafter part of the isolation material aside of the channel regions is removed thereby revealing the channel regions (FIG. 7F).

Figure 8A:
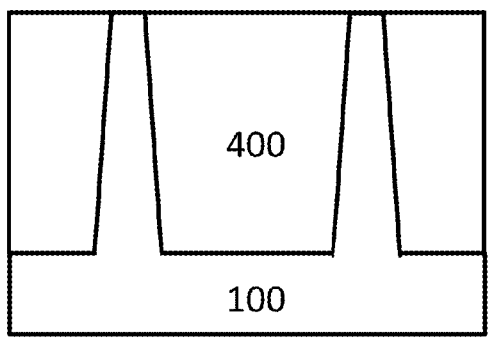
FIG. 8A to FIG. 8E show schematic representation of different process steps of a method for manufacturing a CMOS device according to certain embodiments of the second aspect starting from a pre-patterned STI substrate (FIG. 8A).
Figure 8B:
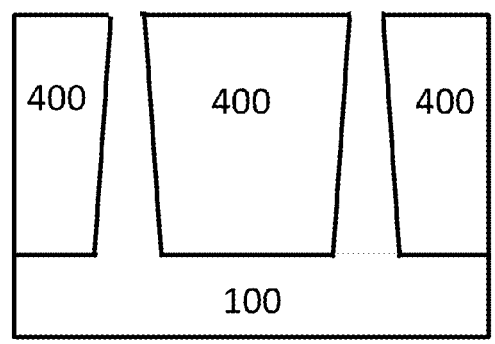
Figure 8C:
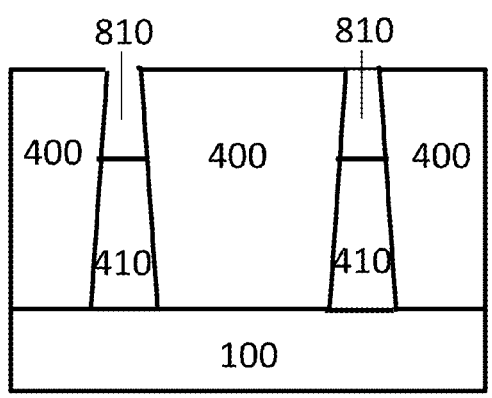
Figure 8D:
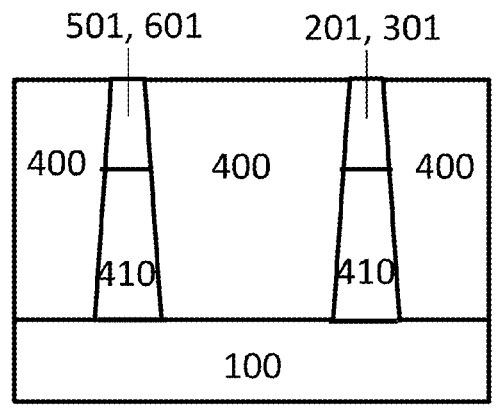
Figure 8E:
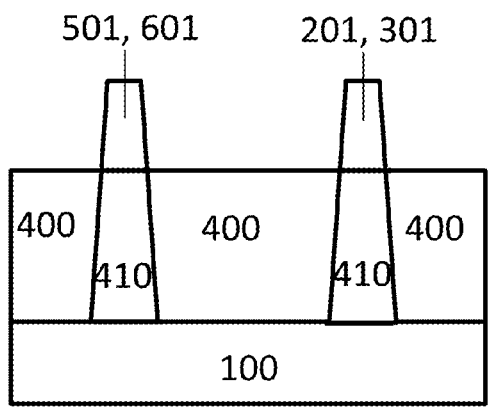

Alternatively, in different embodiments of the disclosure, instead of growing the SRB layer first on a blanket substrate, the SRB layer may be grown in trenches from a pre-defined STI patterned wafer. The patterned SRB layer 410 and the upper layer 201,301,501,601 can be formed by epitaxial growth in pre-defined trenches (FIG. 8A-8E). These trenches are exposing the substrate material 100 at the bottom thereof and have walls made of an insulator (dielectric) material 400. A shallow trench isolation (STI) pattern may be first defined in a substrate 100 such that isolation regions 400 are formed in between two active areas 100 (FIG. 8A). Active areas are thus formed isolated by the dielectric material filling the STI pattern from each other. Then the active areas are recessed up a depth approximately equal to the thickness of the isolation area to form the trenches (FIG. 8B). In the recessed active areas the strain relaxed buffer layer and subsequent layers (upper layer) can be grown (FIG. 8C, FIG. 8D). The channel regions are then revealed by recessing/removing part of the dielectric material 400 (FIG. 8E). This method takes advantage of growing the strain relaxed buffer layer and subsequent layers in high-aspect ratio trenches thereby offering the advantage of trapping the dislocation defects during the epitaxial growth thereby improve the crystalline quality of the grown material.

In embodiments of the disclosure the SRB layer as well as the upper layer formed on the SRB layer may further comprise dopants. For example, dopant elements such as P, As or B are used for short-channel control and for source/drain formation. The latter may include a high doping level, e.g. up to $5 \times 10^{21}$ cm$^{-3}$.

The current disclosure offers a manufacturable solution for a CMOS FinFET device with increased mobility by using a common SRB layer and a common channel material. In an example embodiment, a SiGe 75% SRB layer combined with a Ge channel is common to both nFinFET and pFinFET. By using a recessed SiGe, having 50% Ge, source/drain region for the nFinFET device and a raised Ge source/drain region for the pFinFET device, the CMOS device performance is further enhanced as a whole. For FinFET devices having a top surface and sidewall surface mobility in the channel region, the proposed configuration assures a sidewall mobility for the Ge nFinFET device which is high enough to allow for a limited amount of compressive stress. Simulations (see FIG. 4, FIG. 5, and FIG. 6) indicate that the proposed solution according to certain embodiments outperforms strained Si nFinFET devices as well as strained Si pFinFET devices.

Both so-called gate-last as gate-first approach may be used for the method of manufacturing a dual channel Fin-FET device. Gate-last approach has the advantage that source/drain stressors will be more efficient compared to gate-first approach.

Figures 4A, 4B, 4C:
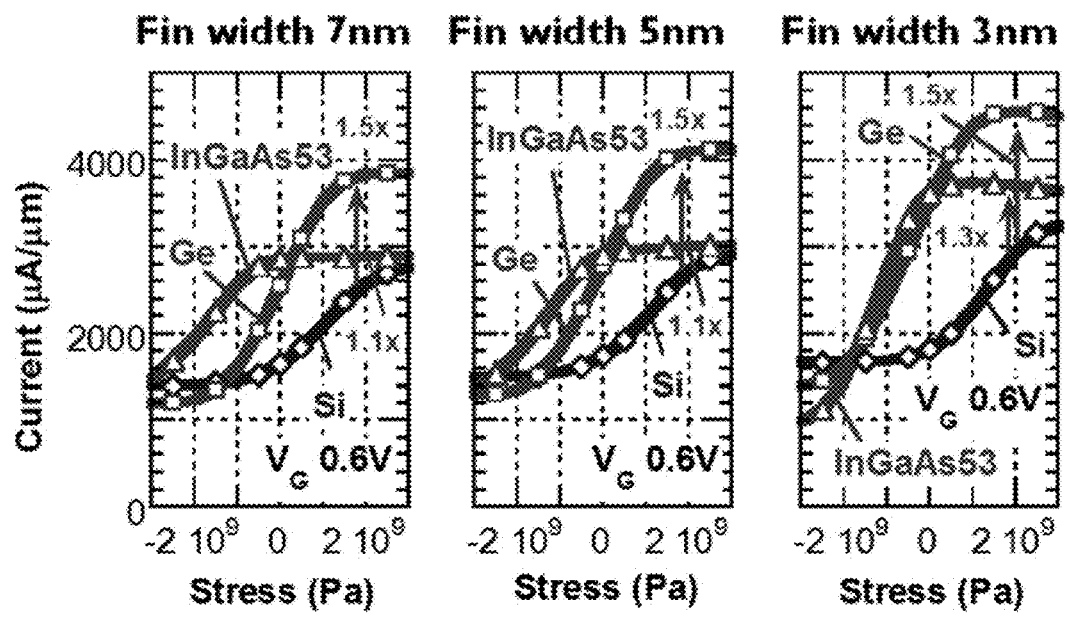
FIG. 4A to FIG. 4C show simulation results for the electrical current properties as function of fin width and stress of an nFinFET of a CMOS semiconductor FinFET device according to the first aspect.

FIG. 4 shows simulation results obtained by using the 2D quantum-mechanical couple Poisson-Schrödinger solver 'Sentaurus Band Structure' from SYNOPSIS. The ballistic current, using is simulated in function of the longitudinal channel stress for prior art Si nFinFET devices (diamond) and Ge nFinFET devices (rectangular) according to embodiments of the present disclosure. The fin height is 30 nm and the fin width is varied from 7 nm (FIG. 4A) to 5 nm (FIG. 4B) and 3 nm (FIG. 4C). The gate voltage applied is 0.6V for all simulations. Positive stress values indicate tensile stress, negative values are compressive stress. All devices have an identical off-current of 100 nA/μm at a gate voltage of 0V.

Experimental results show a significant boost in electron and hole mobility by using the device according to this disclosure. The Ge-channel mobility is increased for both nFinFET and pFinFET with respect to prior-art Si-channel CMOS devices. For hole mobility an increase of 59% is measured, whereas for electron mobility an increase of 38% is measured.

Figure 5:
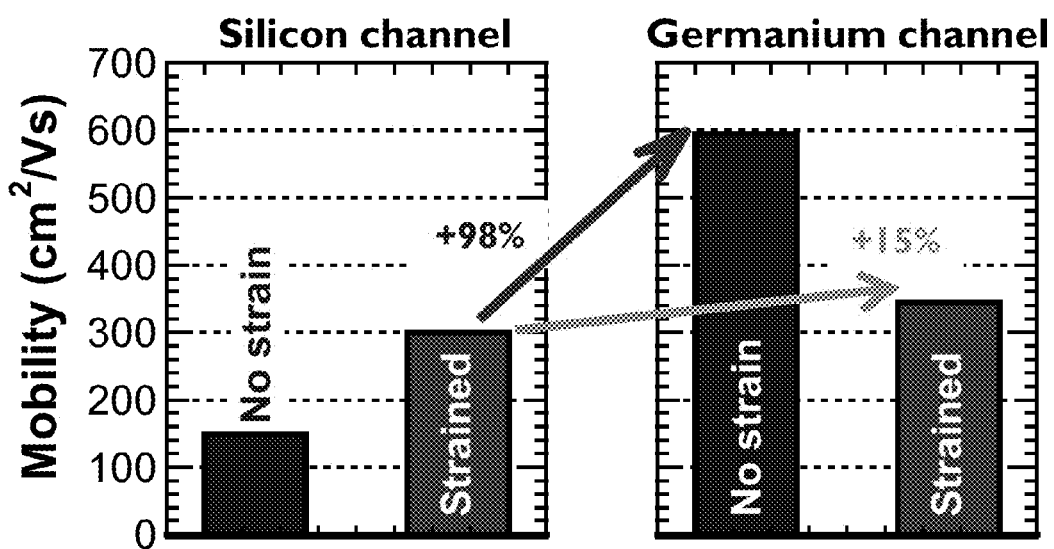
FIG. 5 shows simulation results for the electron mobility as function of strain of a CMOS semiconductor FinFET device according to the first aspect.
Figure 6:
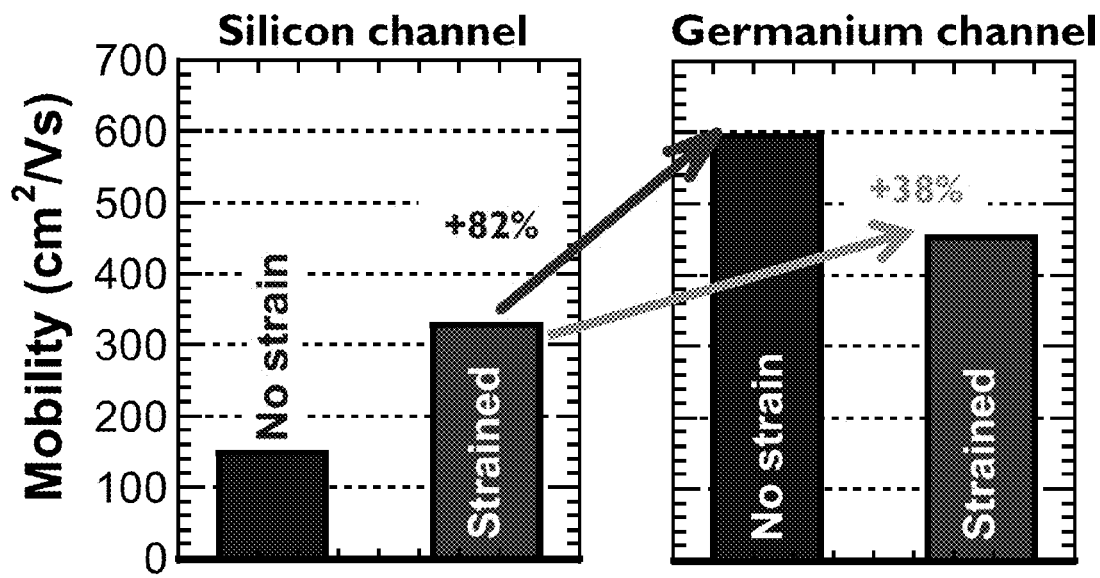
FIG. 6 shows simulation results for the electron mobility of an nFinFET of a CMOS semiconductor FinFET device according to the embodiments of the first aspect.

FIGS. 5 and 6 show simulation results for the Ge electron mobility boost without extra source/drain stressor (FIG. 5) and with extra source/drain stressor (FIG. 6). FIG. 5 shows the electron mobility (i.e. for nFinFET) for a Si-based NFET in a prior art CMOS device (left) and for a Ge-based CMOS device (right) according to embodiments of the present disclosure. The Si-based CMOS device (left) and the Ge-based CMOS device (right) comprise a SiGe SRB layer with a Ge-concentration of 75% for 10 nm nFinFET technology node. The channel material for the Si-based CMOS (left) device is Si, whereas for the Ge-based CMOS (right) it is Ge. No S/D stressor is used. The electron mobility is enhanced by 15% for a Ge-based CMOS device according to embodiments of the present disclosure compared to prior-art Si-based CMOS device.

FIG. 6 shows the electron mobility (i.e. for nFinFET) for prior-art Si-based CMOS device and for a Ge-based CMOS device according to embodiments of the present disclosure. The Si-based CMOS device (left) and the Ge-based CMOS device (right) comprise a SiGe SRB layer with a Ge-concentration of 75% for 10 nm nFinFET technology node. The nFinFET device further comprises a recessed SiGe source/drain region with a SiGe concentration of 65% and a recess of 20 nm. The channel material for the Si-based CMOS (left) device is Si, whereas for the Ge-based CMOS (right) it is Ge. For the Si-based CMOS (FIG. 6, left) the electron mobility is only boosted with about 9% by adding a source/drain stressor compared to the Si-based CMOS device (FIG. 5, left) without source/drain stressor. However by adding a recessed source/drain region to the Ge-based CMOS device (FIG. 6, right) the electron mobility is enhanced with 32% compared to the Ge-based CMOS device (FIG. 5, right) without source/drain stressor. When comparing the electron mobility of the Si-based CMOS device with source/drain stressor (FIG. 6, left) with the electron mobility of the Ge-based CMOS device with source/drain stressor (FIG. 6, right), an increase of 38% is measured for the Ge-mobility. Strained Ge of a Ge-based CMOS FinFET device according to the present disclosure thus outperforms strained Si of a prior-art Si-based CMOS FinFET.

What is claimed is:

1. A CMOS device comprising
a semiconductor substrate,
a patterned strain-relaxed buffer layer of fins comprising silicon germanium (SiGe) on the semiconductor substrate;
on the patterned strain-relaxed buffer layer, an nFinFET having an n-channel region and a pFinFET having a p-channel region, both channel regions isolated from each other by an isolation region and comprising germanium (Ge) whereby the concentration of Ge in the channel regions is higher than the concentration of Ge in the strain-relaxed buffer layer;
source/drain regions comprising SiGe for the nFinFET; and
source/drain regions comprising Ge for the pFiNFET.

2. The CMOS device according to claim 1, wherein the concentration of Ge in the strain-relaxed buffer layer is in the range of 25% to 90%.

3. The CMOS device according to claim 1, wherein the concentration of Ge in the channel region of the nFinFET and of the pFinFET is in the range of 90% to 100%.

4. The CMOS device according to claim 1, wherein the nFinFET has recessed source/drain regions, and wherein the pFinFET has raised source/drain regions.

5. The CMOS device according to claim 1, wherein the concentration of Ge in the nFinFET source/drain regions is lower than the concentration of Ge in the strain-relaxed buffer layer.

6. The CMOS device according to claim 5, wherein the concentration of Ge in the nFinFET source/drain region is less than 80%.

7. The CMOS device according to claim 1, wherein the concentration of Ge in the pFinFET source/drain regions is higher than the concentration of Ge in the strain-relaxed buffer layer.

8. The CMOS device according to claim 7, wherein the concentration of Ge in the pFinFET source/drain regions is in the range between 35% and 100%.

9. The CMOS device according to claim 1, wherein the p-channel region and the n-channel region comprise a same material.

10. A method for manufacturing a CMOS device comprising:
providing a semiconductor substrate;
providing a patterned strain-relaxed buffer layer of fins comprising silicon germanium (SiGe) on the semiconductor substrate;
providing on the fins of the patterned strain-relaxed buffer layer an nFinFET and a pFinFET isolated by an isolation region, the nFinFET having an n-channel region and the pFinFET having a p-channel region, whereby both channel regions comprise germanium (Ge) in a concentration higher than the concentration of Ge in the strain-relaxed buffer layer;
providing source/drain regions comprising SiGe for the nFinFET; and
providing source/drain regions comprising Ge for the pFinFET.

11. The method for manufacturing a CMOS device according to claim 10 wherein providing a patterned strain-relaxed buffer layer comprises:
providing the strain-relaxed buffer layer on the semiconductor substrate;
patterning the strain-relaxed buffer layer thereby forming fins; and
providing a dielectric layer on the patterned strain-relaxed buffer layer.

12. The method for manufacturing a CMOS device according to claim 11 wherein providing on the fins of the patterned strain-relaxed buffer layer an nFinFET and a pFinFET further comprises:
recessing a top part of the fins of the patterned strain-relaxed buffer layer thereby forming trenches having a reduced depth;
epitaxial growing in the reduced depth trenches on the strain-relaxed buffer layer an upper layer thereby forming the n-channel of the nFinFET and the p-channel of the pFinFET; and
removing a top part of the dielectric layer thereby revealing the n-channel and p-channel.

13. The method for manufacturing a CMOS device according to claim 10 wherein providing the patterned strain-relaxed buffer layer of fins comprises:
patterning the semiconductor substrate thereby forming semiconductor fins isolated from each other by isolation regions;
recessing the semiconductor material of the semiconductor fins down to the bottom part of the isolation regions thereby forming trenches in between the isolation regions; and
epitaxial growing the strain-relaxed buffer layer in part of the trenches thereby forming fins.

14. The method for manufacturing a CMOS device according to claim 13 wherein providing on the fins of the patterned strain-relaxed buffer layer the nFinFET and the pFinFET further comprises:
epitaxial growing an upper layer on the epitaxial grown strain-relaxed buffer layer in the remaining part of the trenches thereby forming the n-channel and the p-channel; and
removing a top part of the dielectric layer thereby revealing the n-channel and p-channel.

15. The method for manufacturing a CMOS device according to claim 10, wherein the concentration of Ge in the strain-relaxed buffer layer is in the range of 25% to 90%.

16. The method for manufacturing a CMOS device according to claim 10, wherein providing the nFinFET source/drain regions comprises providing recessed source/drain regions, and wherein providing the pFinFET source/drain regions comprises providing raised source/drain regions.

17. The method for manufacturing a CMOS device according to claim 10, wherein the concentration of Ge in the nFinFET source/drain regions is less than the concentration of Ge in the strain-relaxed buffer layer, and wherein the concentration of Ge in the pFinFET source/drain regions is higher than concentration of Ge in the strain-relaxed buffer layer.

18. The method for manufacturing a CMOS device according to claim 17, wherein the concentration of Ge in the nFinFET source/drain regions is in the range between 35% and 100%, and wherein the concentration of Ge in the pFinFET source/drain regions is less than 80%.

19. The method for manufacturing a CMOS device according to claim 10, wherein the n-channel region and the p-channel region comprise a same material.

* * * * *